(12) United States Patent
Chanemougame et al.

(10) Patent No.: US 10,629,516 B2
(45) Date of Patent: Apr. 21, 2020

(54) HYBRID DUAL DAMASCENE STRUCTURES WITH ENLARGED CONTACTS

(71) Applicant: GLOBALFOUNDRIES Inc., Grand Cayman (KY)

(72) Inventors: Daniel Chanemougame, Niskayuna, NY (US); Julien Frougier, Albany, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/114,600

(22) Filed: Aug. 28, 2018

(65) Prior Publication Data

US 2020/0075456 A1 Mar. 5, 2020

(51) Int. Cl.
*H01L 23/48* (2006.01)
*H01L 21/768* (2006.01)
*H01L 23/532* (2006.01)
*H01L 29/08* (2006.01)
*H01L 27/108* (2006.01)

(52) U.S. Cl.
CPC ...... *H01L 23/481* (2013.01); *H01L 21/76807* (2013.01); *H01L 21/76829* (2013.01); *H01L 21/76877* (2013.01); *H01L 23/5329* (2013.01); *H01L 29/0847* (2013.01)

(58) Field of Classification Search
CPC ............. H01L 23/481; H01L 21/76829; H01L 29/0847; H01L 23/5329; H01L 21/76807; H01L 21/76877; H01L 27/108
See application file for complete search history.

(56) References Cited

U.S. PATENT DOCUMENTS

| | | | |
|---|---|---|---|
| 2001/0050392 A1* | 12/2001 | Nakamura | H01L 27/10852 257/309 |
| 2002/0113237 A1* | 8/2002 | Kitamura | H01L 23/485 257/71 |
| 2005/0026380 A1* | 2/2005 | Kammler | H01L 29/665 438/305 |
| 2008/0258228 A1* | 10/2008 | Chuang | H01L 21/76895 257/369 |
| 2016/0284806 A1* | 9/2016 | Park | H01L 29/41791 |

* cited by examiner

*Primary Examiner* — Marcos D. Pizarro
*Assistant Examiner* — Sue Tang
(74) *Attorney, Agent, or Firm* — Thompson Hine LLP; Francois Pagette

(57) ABSTRACT

Structures for field-effect transistors and methods for fabricating a structure for field-effect transistors. A contact structure is formed that includes a first contact arranged over a source/drain region and a second contact arranged over the first contact. A dielectric cap is formed over the second contact. A via is formed that extends in a vertical direction through the dielectric cap to the second contact. An interconnect is formed over the dielectric cap, and is connected by the via with the second contact.

20 Claims, 5 Drawing Sheets

HYBRID DUAL DAMASCENE STRUCTURES WITH ENLARGED CONTACTS

BACKGROUND

The invention relates generally to semiconductor devices and integrated circuit fabrication and, in particular, to structures for field-effect transistors and methods for fabricating a structure for field-effect transistors.

Device structures for a field-effect transistor generally include a source, a drain, and a gate electrode configured to switch carrier flow between the source and drain in a channel formed in an active region of semiconductor material arranged beneath the gate electrode. When a control voltage exceeding a designated threshold voltage is applied to the gate electrode, the flow of carriers in the channel produces a device output current.

The source and drain are directly contacted from above by a contact structure that includes a trench silicide contact and a metal contact that connects the trench silicide contact with a track among a set of parallel tracks in an overlying metallization level. The metal contact has a resistance that scales inversely with area. As the track pitch scales downward and the available space for the metal contact decreases, the related reduction in area of the metal contact may increase the resistance to an unacceptable value. The spacing between the tracks in the overlying metallization level also decreases with decreasing track pitch. As a result of tighter spacing, the metal contact cannot be arbitrarily widened without a risk of shorting to a neighboring track that is arranged adjacent to the contacted track. This restriction may also prohibit contacting a track that is not arranged over the active region.

Improved structures for field-effect transistors and methods for fabricating a structure for field-effect transistors are needed.

SUMMARY

In an embodiment of the invention, a structure includes a source/drain region, a contact structure including a first contact over the source/drain region and a second contact over the first contact, a dielectric cap over the second contact, an interconnect over the dielectric cap, and a via extending in a vertical direction through the dielectric cap to the second contact. The via connects the interconnect with the second contact.

In an embodiment of the invention, a method includes forming a source/drain region, forming a first contact over the source/drain region, and forming a second contact over the first contact. After recessing the second contact, a dielectric cap is formed over the second contact. The method further includes forming a via extending in a vertical direction through the dielectric cap to the second contact, and forming an interconnect arranged over the dielectric cap. The interconnect is connected by the via with the second contact.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
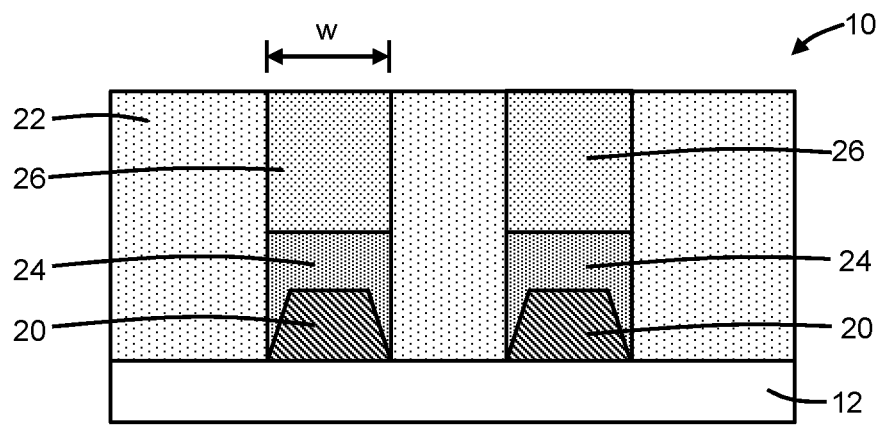
FIGS. 1-7 are cross-sectional views of a structure at successive fabrication stages of a processing method in accordance with an embodiment of the invention.

With reference to FIG. 1 and in accordance with an embodiment of the invention, one or more field-effect transistors 10 may be fabricated by complementary metal oxide semiconductor (CMOS) processes during front-end-of-line (FEOL) processing. The one or more field-effect transistors 10 may be arranged in a device area of a substrate 12, which may be a bulk single-crystal silicon substrate. Raised source/drain regions 20 are composed of an epitaxial semiconductor material that is grown by an epitaxial growth process using the crystal structure of the single-crystal semiconductor material of the substrate 12 as a growth template. As used herein, the term "source/drain region" means a doped region of semiconductor material that can function as either a source or a drain of a field-effect transistor. In an embodiment, the semiconductor material constituting the raised source/drain regions 20 may be silicon-germanium (SiGe) having a germanium content ranging from twenty percent (20%) to fifty percent (50%) and may include a silicon capping layer. In an embodiment, the semiconductor material constituting the raised source/drain regions 20 may be silicon. The shape of the raised source/drain regions 20 may differ from the depicted shape.

An interlayer dielectric layer 22 may be formed over the raised source/drain regions 20. The interlayer dielectric layer 22 may be comprised of an electrically-insulating dielectric material, such as silicon dioxide ($SiO_2$). Sections of the interlayer dielectric layer 22 arranged over the source/drain regions 20 are removed, and trench silicide (TS) contacts 24 and contacts 26 are formed as contact structures in the opened spaces. The contacts 26 are physically and electrically connected by the TS contacts 24 with the source/drain regions 20. The TS contacts 24, which are arranged in a vertical direction between the source/drain regions 20 and the contacts 26, may contain a metal silicide, such as tungsten silicide ($WSi_2$), titanium silicide ($TiSi_2$), nickel silicide (NiSi), or cobalt silicide ($CoSi_2$), formed by silicidation. The contacts 26, which are arranged over the TS contacts 24, may contain a metal, such as tungsten (W), deposited by chemical vapor deposition and may be planarized by chemical-mechanical polishing (CMP).

In the representative embodiment, the contacts 26 and the TS contacts 24 may have equal or substantially equal widths, w. In an alternative embodiment, the contacts 26 may be wider than the TS contacts 24 due to the relaxation of restrictions on the width of the contacts 26, as subsequently described.

The one or more field-effect transistors 10 may further include gate structures (not shown) having a gate electrode and a gate dielectric arranged between the gate electrode and the substrate 12. The gate dielectric may be composed of a dielectric material, such as a high-k dielectric material like hafnium oxide ($HfO_2$), deposited by atomic layer deposition. The gate electrode may include one or more conformal barrier metal layers and/or work function metal layers, such as layers composed of titanium aluminum carbide (TiAlC) and/or titanium nitride (TiN), deposited by atomic layer deposition, and a metal gate fill layer composed of a conductor, such as tungsten (W), deposited by chemical vapor deposition.

Figure 2:
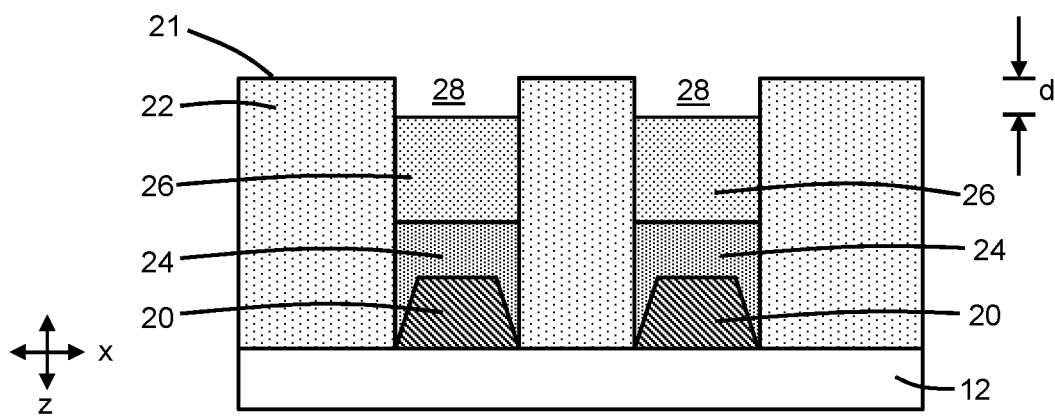

With reference to FIG. 2 in which like reference numerals refer to like features in FIG. 1 and at a subsequent fabrication stage, the contacts 26 are recessed in a vertical direction (i.e., the z-direction) relative to a top surface 21 of the interlayer dielectric layer 22 by a distance, d, to form cavities 28. The contacts 26 may be recessed using an etching process, such as a reactive ion etching process, that removes the material of the contacts 26 selective to the material of the interlayer dielectric layer 22. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The recessing of the contacts 26 reduces their thickness, which may be effective to reduce their vertical resistance, but does not modify their widths, w, in a lateral direction (i.e., the x-direction).

Figure 3:
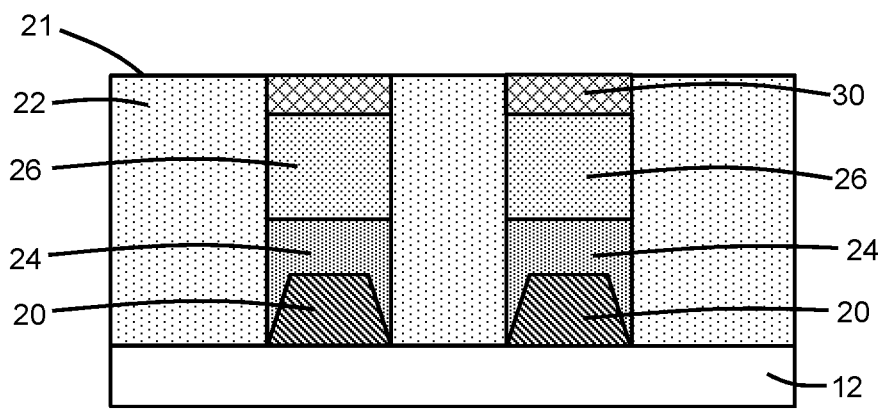

With reference to FIG. 3 in which like reference numerals refer to like features in FIG. 2 and at a subsequent fabrication stage, a dielectric cap 30 is formed in each of the cavities 28 (FIG. 2). The dielectric caps 30 are respectively arranged over one of the recessed contacts 26. The dielectric caps 30 may be composed of a dielectric material, such as a silicon nitride like silicon oxycarbonitride (SiOCN) or a silicon oxide like carbon-incorporated silicon oxide (SiOC), that is deposited by atomic layer deposition (ALD) and planarized to be coplanar with the top surface 21 of the interlayer dielectric layer 22 by chemical-mechanical polishing (CMP). The dielectric caps 30 and the contacts 26 may have equal or substantially equal widths, w, due to the constraint on lateral dimensions provided by the surfaces of the interlayer dielectric layer 22 bordering the cavities 28.

Figure 4:
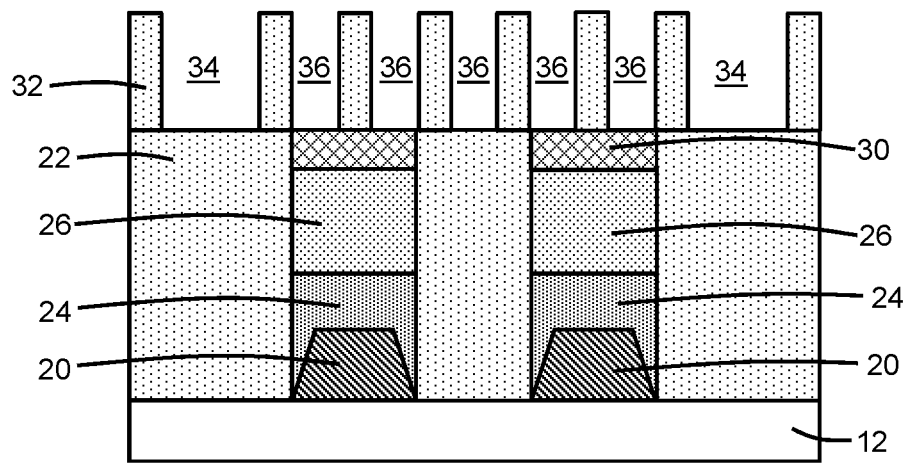

With reference to FIG. 4 in which like reference numerals refer to like features in FIG. 3 and at a subsequent fabrication stage, an interlayer dielectric layer 32 may be formed over the raised source/drain regions 20 and interlayer dielectric layer 22. The interlayer dielectric layer 32 may be comprised of an electrically-insulating dielectric material, such as silicon dioxide ($SiO_2$). The interlayer dielectric layer 32 may be patterned with lithography and etching processes to defined trenches 34, 36. The etch mask (not shown) used to pattern the interlayer dielectric layer 32 may be composed of a layer of photoresist that may be applied as a fluid by a spin coating process, pre-baked, exposed to light projected through a photomask, baked after exposure, and developed with a chemical developer. In an embodiment, the trenches 34 may be wider than the trenches 36, and may be arranged at the periphery of the grouping of the trenches 36. The etching process may remove the material of the interlayer dielectric layer 32 selective to the material of the dielectric caps 30 such that the etching process forming the trenches 34, 36 stops on the dielectric caps 30.

Figure 5:
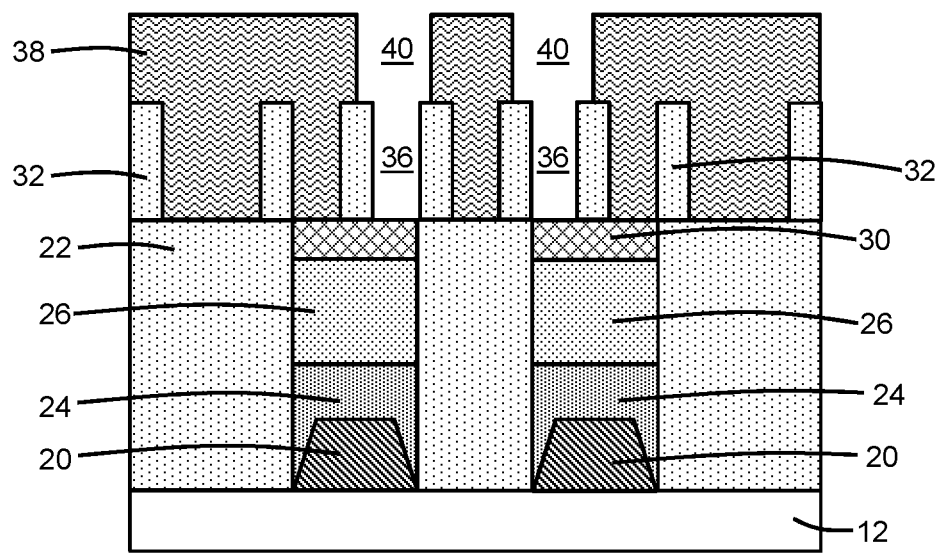

With reference to FIG. 5 in which like reference numerals refer to like features in FIG. 4 and at a subsequent fabrication stage, a removable etch mask 38 is formed that includes openings 40 that are respectively aligned with the dielectric caps 30 over the recessed contacts 26. The etch mask 38 may include an organic planarization layer (OPL) material that is applied by spin-coating and patterned with lithography and etching processes to form the openings 40. Each opening 40 in the etch mask 38 may be aligned to intersect a lengthwise portion of one of the trenches 36 at a location over the respective dielectric cap 30. In an alternative embodiment, one or more of the openings 40 may be aligned to intersect a lengthwise portion of one of the trenches 34.

Each opening 40 is self-aligned to one of the contacts 26 and to one of the trenches 36 by one or more surfaces of the interlayer dielectric layer 32 bordering the sidewalls of the lengthwise portion of one of the trenches 36. As a result, the section of each opening 40 in the interlayer dielectric layer 32 has the same dimensions and location as the portion of the respective trench 36 providing the self-alignment. The etching process may be selective to remove the material of the etch mask 38 selective to the materials of the dielectric caps 30 and interlayer dielectric layer 32 such that the etching process forming the openings 40 stops on the dielectric caps 30.

Figure 6:
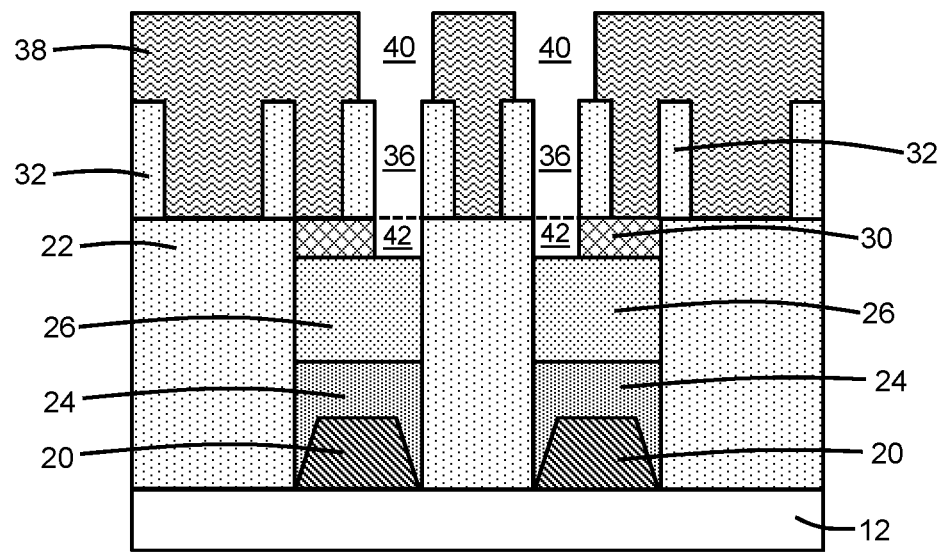

With reference to FIG. 6 in which like reference numerals refer to like features in FIG. 5 and at a subsequent fabrication stage, via openings 42 are formed that extend through the dielectric caps 30 with an etching process that removes the material of the dielectric caps 30 selective to the materials of the contacts 26, interlayer dielectric layer 32, and etch mask 38. The via openings 42 have a width that is equal or substantially equal to the width of the trenches 36, and have a length that is established by the length of the openings 40. The contacts 26 may function as an etch stop for the etching process. Following the etching process, the etch mask 38 may be removed by, for example, ashing using an oxygen-based plasma.

Figure 7:
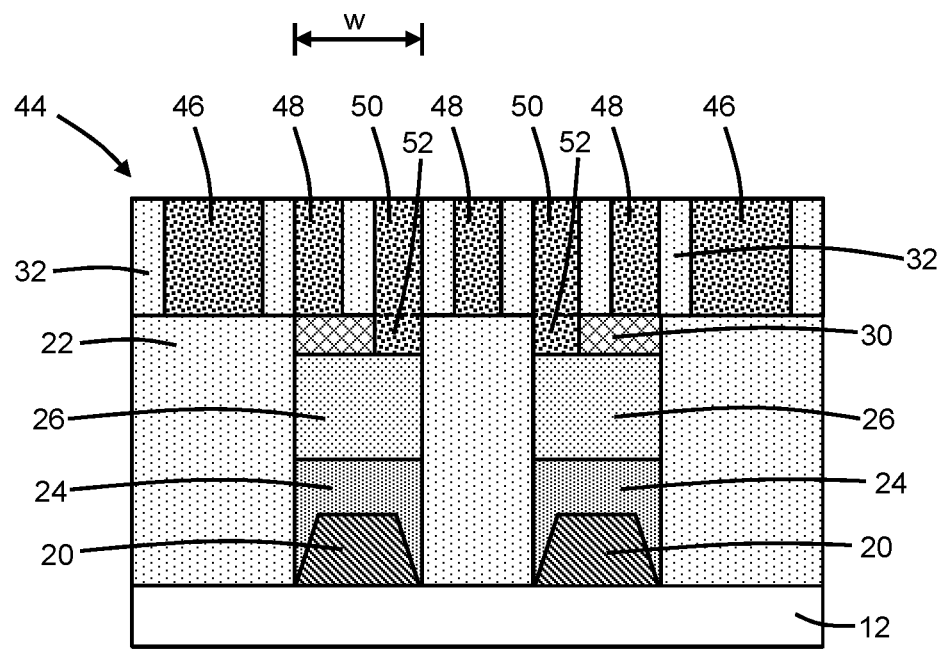

With reference to FIG. 7 in which like reference numerals refer to like features in FIG. 6 and at a subsequent fabrication stage, an interconnect structure 44 is formed by forming interconnects 46 in the trenches 34, interconnects 48, 50 in the trenches 36, and interconnects 52 in the via openings 42. The interconnects 46, 48, 50 are features in the form of wires that are embedded in the interlayer dielectric layer 32 as a metallization level (e.g., the lowest metallization level, M0) of the interconnect structure 44. The interconnects 52 are features in the form of contacts or vias that are embedded in the interlayer dielectric layer 32. In the representative embodiment, each interconnect 52 connects one of the interconnects 50 with one of the contacts 26.

The primary conductor of the interconnects 46, 48, 50, 52 may be composed of a low-resistivity metal formed using a deposition process, such as copper (Cu), ruthenium (Ru) or cobalt (Co) deposited by electroplating or electroless deposition, chemical vapor deposition, etc. A liner (not shown) composed of titanium (Ti), titanium nitride (TiN), tantalum (Ta), tantalum nitride (TaN), or a layered combination of these materials (e.g., a bilayer of TaN/Ta) may be applied to the trenches 34, 36 and via openings 40 before filling with the primary electrical conductor.

The interconnects 46, which may represent power rails, are wider than the interconnects 48, 50, which may represent signal tracks. The interconnects 46, 48, 50 may be routed across several cells to provide power and signals to the transistors in each cell. The number of interconnects 46, 48 may vary and, in different embodiments, the number of interconnects may be equal to either four (4) or five (5).

The recessing of the contacts 26 and the addition of the dielectric caps 30 permits the contacts 26 to be widened in comparison with conventional contacts. Specifically, the dielectric caps 30 isolate the contacts 26 from the interconnects 48 that are passing over the contacts 26 without connection. The dielectric caps 30 are arranged between the contacts 26 and the interconnects 48, which promotes the widening by reducing or eliminating the risk of shorting between the contacts 26 and interconnects 48 as would occur in conventional contact and interconnect formation. The interconnects 52 provide secondary contacts between the interconnects 50 and the contacts 26 that also promote decoupling of the width of the contacts 26 relative to the width of the interconnects 50. The increased width of the contacts 26 may reduce their vertical resistance due to the ability to increase their cross-sectional area. In the representative embodiment, the width, w, of the contacts 26 and the TS contacts 24 may be equal. However, in an alternative embodiment, the contacts 26 may be wider than the TS contacts 24 due to the relaxation of restrictions on the width of the contacts 26. Conventional contacts are restricted to being narrower than the TS contacts 24 to avoid shorting with nearest-neighbor interconnects in the metallization level. The width of the contacts 26 may also be selected to provide an optimized resistance-capacitance product.

Figure 8:
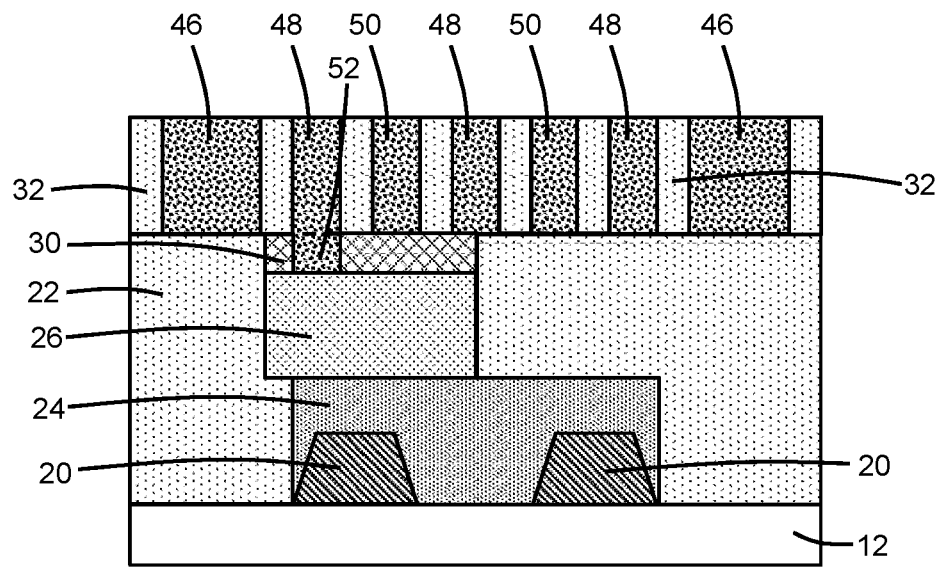
FIGS. 8-11 are cross-sectional views similar to FIG. 7 of structures in accordance with alternative embodiments of the invention.

With reference to FIG. 8 in which like reference numerals refer to like features in FIG. 7 and in accordance with an alternative embodiment, the TS contacts 24 may be merged to connect or strap an adjacent pair of the raised source/drain regions 20, and one of the contacts 26 may be used to connect one of the interconnects 50 with the merged TS contacts 24. For example, one of the connected source/drain regions 20 may belong to an n-type field-effect transistor and the other of the connected source/drain regions 20 may belong to a p-type field-effect transistor that are strapped together by the merged TS contacts 24.

Figure 9:
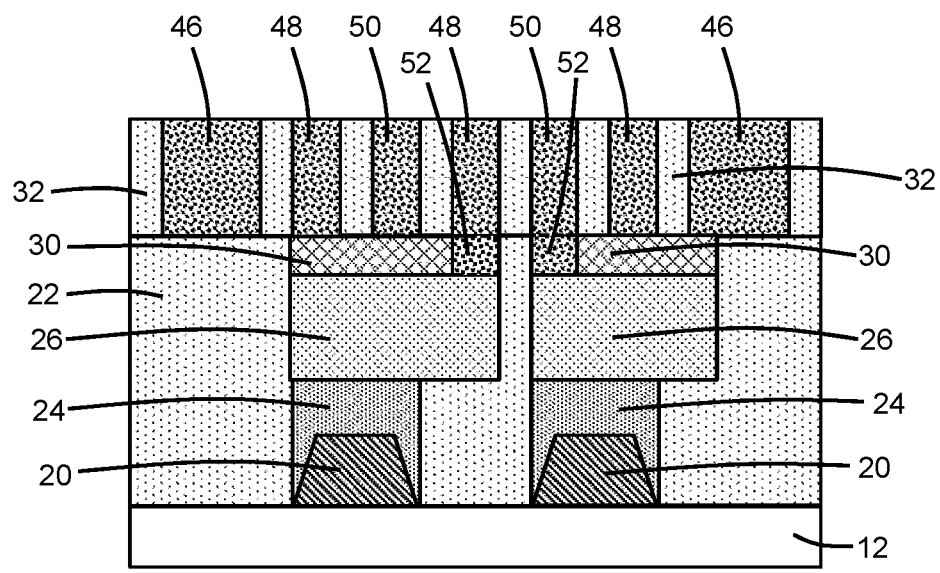

With reference to FIG. 9 in which like reference numerals refer to like features in FIG. 7 and in accordance with an alternative embodiment, one or more of the contacts 26 may be widened to permit the interconnect 52 to be used to connect the contact 26 with one of the interconnects 48 that is not directly over the contact 26. In other words, the interconnect 52 can be displaced in the lateral direction due to the widening of the contact 26 to facilitate the connection. The dielectric cap 30, which may have the same width as the widened contact 26, isolates the widened contact 26 from the overlying interconnects 48, 50 that are not connected with the contacts 26.

Figure 10:
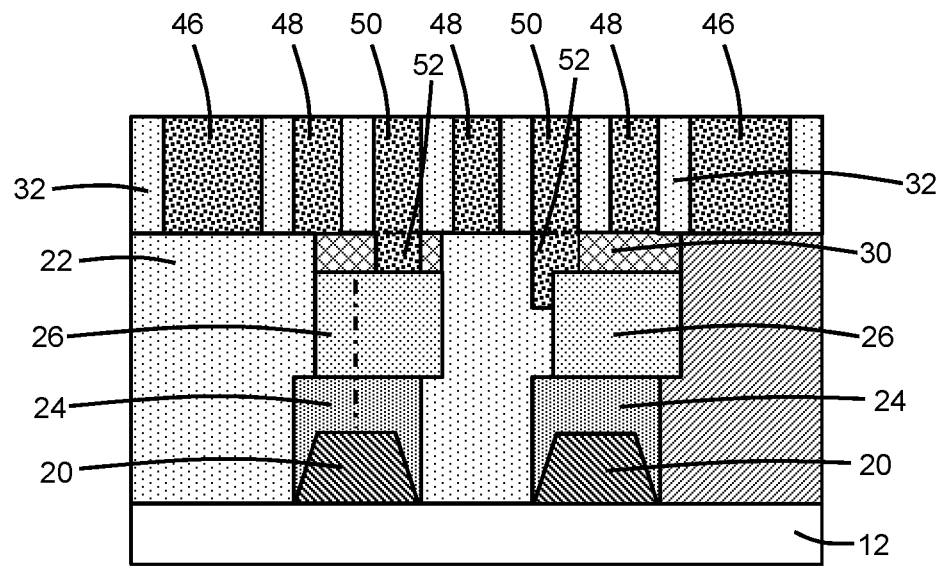

With reference to FIG. 10 in which like reference numerals refer to like features in FIG. 7 and in accordance with an alternative embodiment, the contacts 26 may be laterally offset from the TS contacts 24 and arranged outside of the outer boundary (i.e., the enclosure) of the TS contacts 24, instead of being constrained to arrangement inside the outer boundary of the TS contacts 24. The flexibility afforded by the dielectric caps 30 and interconnects 52 permits such a laterally-offset arrangement in which the contacts 26 are not centered relative to a centerline (shown in dot-dashed lines) of the TS contacts 24. Depending on the arrangement between the dielectric cap 30 and the interconnect 52, the contact 26 may be contacted at its top surface and side surface by the interconnect 52 if a portion of the opening 42 (FIG. 6) is not aligned with the dielectric cap 30 and instead penetrates through the interlayer dielectric layer 22 to overlap with the side edge of the contact 26.

Figure 11:
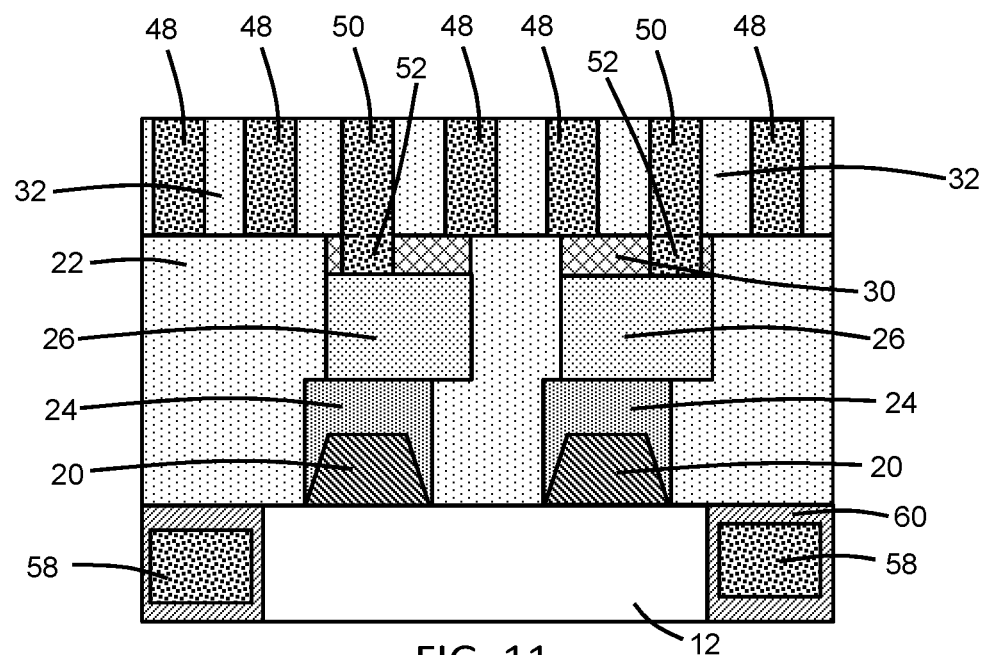

With reference to FIG. 11 in which like reference numerals refer to like features in FIG. 7 and in accordance with an alternative embodiment, the interconnects 48 providing the power rails may be replaced by buried power rails 58 that are not arranged in the interconnect structure 44. Instead, the buried power rails 58 may be arranged in trench isolation regions 60 that are located in the substrate 12. The widening of the contacts 26 may permit a denser packing of the interconnects 48, 50 in the interlayer dielectric layer 32 of the metallization level of the interconnect structure 44. For example, the widening of the contacts 26 may permit the number of interconnects 48, 50 to be increased from four (4) to five (5) so as to provide five signal tracks instead of the four signal tracks as found in conventional metallization level layouts.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a first source/drain region;
    an interlayer dielectric layer having a top surface,
    a contact structure including a first contact over the first source/drain region and a second contact over the first contact;
    a dielectric cap over the second contact;
    a first interconnect over the dielectric cap; and
    a via extending in a vertical direction through the dielectric cap to the second contact, the via connecting the first interconnect with the second contact,
    wherein the second contact and the dielectric cap are embedded in the interlayer dielectric layer in a stack, and the dielectric cap is coplanar with the top surface of the interlayer dielectric layer.

2. The structure of claim 1 wherein the first contact has a first width in a lateral direction, and the second contact has a second width in the lateral direction that is greater than the first width.

3. The structure of claim 1 further comprising:
    a second interconnect over the second contact,
    wherein the dielectric cap isolates the second interconnect from the second contact.

4. The structure of claim 1 further comprising:
a second source/drain region,
wherein the first contact straps the first source/drain region with the second source/drain region.

5. The structure of claim 1 wherein the first contact is comprised of a metal silicide, and the second contact is comprised of a metal.

6. The structure of claim 1 wherein the second contact is offset laterally from the first contact and the first source/drain region such that the second contact and the first contact are not centered.

7. The structure of claim 1 wherein the first contact has a first width in a lateral direction transverse to the vertical direction, and the dielectric cap has a second width in the lateral direction that is substantially equal to the first width.

8. The structure of claim 1 wherein the first interconnect is not directly over the first contact.

9. A structure comprising:
a first source/drain region;
a contact structure including a first contact over the first source/drain region and a second contact over the first contact;
a dielectric cap over the second contact;
a first interconnect over the dielectric cap; and
a via extending in a vertical direction through the dielectric cap to the second contact, the via connecting the first interconnect with the second contact,
wherein the second contact is offset laterally from the first contact and the first source/drain region such that the second contact and the first contact are not centered.

10. The structure of claim 9 wherein the first interconnect is not directly over the first contact.

11. The structure of claim 9 wherein the first contact has a first width in a lateral direction, and the second contact has a second width in the lateral direction that is greater than the first width.

12. The structure of claim 9 further comprising:
a second interconnect over the second contact,
wherein the dielectric cap isolates the second interconnect from the second contact.

13. The structure of claim 9 further comprising:
a second source/drain region,
wherein the first contact straps the first source/drain region with the second source/drain region.

14. The structure of claim 9 wherein the first contact is comprised of a metal silicide, and the second contact is comprised of a metal.

15. A structure comprising:
a first source/drain region;
a contact structure including a first contact over the first source/drain region and a second contact over the first contact;
a dielectric cap over the second contact;
a first interconnect over the dielectric cap; and
a via extending in a vertical direction through the dielectric cap to the second contact, the via connecting the first interconnect with the second contact,
wherein the first contact has a first width in a lateral direction transverse to the vertical direction, and the dielectric cap has a second width in the lateral direction that is substantially equal to the first width.

16. The structure of claim 15 wherein the first interconnect is not directly over the first contact.

17. The structure of claim 15 wherein the first contact has a third width in the lateral direction, and the second contact has a fourth width in the lateral direction that is greater than the third width.

18. The structure of claim 15 further comprising:
a second interconnect over the second contact,
wherein the dielectric cap isolates the second interconnect from the second contact.

19. The structure of claim 15 further comprising:
a second source/drain region,
wherein the first contact straps the first source/drain region with the second source/drain region.

20. The structure of claim 15 wherein the first contact is comprised of a metal silicide, and the second contact is comprised of a metal.

* * * * *